(12) United States Patent
Piner

(10) Patent No.: US 10,903,076 B2
(45) Date of Patent: Jan. 26, 2021

(54) MATERIAL SELECTIVE REGROWTH STRUCTURE AND METHOD

(71) Applicant: The Texas State University—San Marcos, San Marcos, TX (US)

(72) Inventor: Edwin L. Piner, New Braunfels, TX (US)

(73) Assignee: The Texas State University—San Marcos, San Marcos, TX (US)

( * ) Notice: Subject to any disclaimer, the term of this patent is extended or adjusted under 35 U.S.C. 154(b) by 0 days.

(21) Appl. No.: 16/568,658

(22) Filed: Sep. 12, 2019

(65) Prior Publication Data

US 2020/0006070 A1 Jan. 2, 2020

Related U.S. Application Data

(60) Division of application No. 15/298,005, filed on Oct. 29, 2016, now Pat. No. 10,504,725, which is a continuation of application No. PCT/US2014/035423, filed on Apr. 25, 2014.

(51) Int. Cl.
*H01L 21/02* (2006.01)
*H01L 29/06* (2006.01)

(52) U.S. Cl.
CPC .... *H01L 21/02647* (2013.01); *H01L 21/0243* (2013.01); *H01L 21/0254* (2013.01); *H01L 21/02389* (2013.01); *H01L 21/02458* (2013.01); *H01L 21/02639* (2013.01); *H01L 29/0665* (2013.01)

(58) Field of Classification Search
CPC ........... H01L 21/02647; H01L 21/0243; H01L 29/0665
USPC ............................................ 257/183; 438/60
See application file for complete search history.

(56) References Cited

U.S. PATENT DOCUMENTS

| 4,838,758 A | 6/1989 | Sheth |
| 5,722,812 A | 3/1998 | Knox et al. |
| 6,153,010 A | 11/2000 | Kiyoku |
| 6,525,346 B2* | 2/2003 | Mizutani ............ H01L 21/8252 257/142 |
| 8,946,724 B1* | 2/2015 | Shinohara ......... H01L 29/66143 257/76 |

(Continued)

FOREIGN PATENT DOCUMENTS

| CA | 1148188 | 6/1983 |
| WO | 2012/0117247 | 9/2012 |

(Continued)

OTHER PUBLICATIONS

Extended European Search Report for European Patent Application No. 14900965.6, dated Oct. 9, 2017; 7 pages.

(Continued)

*Primary Examiner* — Sheikh Maruf
(74) *Attorney, Agent, or Firm* — Baker Botts L.L.P.

(57) ABSTRACT

The disclosure relates to a method for creating a nanoscale structure. The method includes forming a window in a semiconductor structure, the semiconductor structure comprising a substrate, a first semiconductor layer, and a mask layer; depositing a second semiconductor layer within the window such that a gap remains between the second semiconductor and a portion of the window; and regrowing the first semiconductor layer such that the first semiconductor layer fills the gap.

11 Claims, 5 Drawing Sheets

(56) References Cited

U.S. PATENT DOCUMENTS

| | | | |
|---|---|---|---|
| 2001/0054718 A1* | 12/2001 | Tanomura | H01L 29/66318 257/183 |
| 2003/0092230 A1 | 5/2003 | Koike | |
| 2003/0162340 A1* | 8/2003 | Tezen | H01L 21/02639 438/184 |
| 2004/0029365 A1 | 2/2004 | Linthicum | |
| 2004/0091352 A1 | 5/2004 | Gay et al. | |
| 2004/0113166 A1* | 6/2004 | Tadatomo | H01L 33/22 257/98 |
| 2005/0186764 A1 | 8/2005 | Wu | |
| 2006/0255363 A1 | 11/2006 | Shibata | |
| 2007/0029643 A1 | 2/2007 | Johnson et al. | |
| 2007/0278518 A1* | 12/2007 | Chen | H01L 29/7787 257/192 |
| 2007/0295993 A1* | 12/2007 | Chen | H01L 29/7786 257/194 |
| 2009/0079034 A1 | 3/2009 | Wang | |
| 2010/0035412 A1 | 2/2010 | Samuelson | |
| 2010/0072516 A1* | 3/2010 | Tamura | H01L 29/66462 257/192 |
| 2010/0140660 A1* | 6/2010 | Wu | H01L 29/872 257/183 |
| 2011/0127541 A1* | 6/2011 | Wu | H01L 29/0615 257/76 |
| 2012/0248411 A1 | 4/2012 | Lee | |
| 2013/0134443 A1* | 5/2013 | Terano | H01L 29/66212 257/77 |
| 2013/0193558 A1 | 8/2013 | Ju | |
| 2014/0084339 A1* | 3/2014 | Nishimori | H01L 21/0254 257/183 |
| 2014/0106546 A1 | 4/2014 | Lochtefeld et al. | |
| 2015/0318360 A1* | 11/2015 | Lu | H01L 21/8258 257/192 |
| 2017/0067182 A1 | 3/2017 | Shibata | |
| 2017/0373468 A1 | 12/2017 | Izumi | |

FOREIGN PATENT DOCUMENTS

| | | |
|---|---|---|
| WO | WO2012/0117247 | 9/2012 |
| WO | 2015/0163908 | 10/2015 |

OTHER PUBLICATIONS

International Search Report and Written Opinion of PCT Application PCT/US2014/035423, dated Aug. 27, 2014; 7 pages.

International Preliminary report on Patentability of PCT Application PCT/US2014/035423, dated Oct. 25, 2016, 5 pages.

* cited by examiner

MATERIAL SELECTIVE REGROWTH STRUCTURE AND METHOD

PRIORITY CLAIM

This application is a divisional application of U.S. patent application Ser. No. 15/298,005 filed Oct. 19, 2016, which is a continuation application of International Application PCT/US2014/035423 filed Apr. 25, 2014.

STATEMENT OF GOVERNMENT INTEREST

This invention was made with government support under Grant no. ONR N00014-12-10971 awarded by the Department of Defense. The government has certain rights in the invention.

TECHNICAL FIELD

The present disclosure relates to selective regrowth of nanoscale structures. It also relates to methods of forming selectively regrown structures and their use in forming nanoscale structures, such as nanotrenches, nanochannels, nanofins, and the like.

BACKGROUND

Creating densely packed nanostructures is critical to the emerging field of nanotechnology and to the advanced semiconductor integrated circuits (IC) industry. One of the first steps typically employed in creating advanced ICs is to use lithography to define a pattern. The scaling of the pattern to nanotechnology dimensions, however, may create challenges for the material and processes employed due to the physical limitations of both. The critical dimensions of current state of the art devices are on the scale of nanometers. Designing devices at this scale may lead to a variety of issues including optics (fringing) effects and nanoscale alignment. Further, current techniques often require multiple masking steps in order to create nanostructures. Therefore, it is highly desirable to have a technique to form nanostructures that allows for the creation of non-uniform material features with a simplified fabrication process.

SUMMARY

The disclosure relates to a method for creating a nanoscale structure. The method includes forming a window in a semiconductor structure, the semiconductor structure comprising a substrate, a first layer, and a mask layer; depositing a second layer within the window such that a gap remains between the second layer and a portion of the window.

The present disclosure further relates to regrowing the material comprising the first layer such that the first layer material fills the gap.

The present disclosure further relates to repeating the depositing and regrowth steps as necessary such that a nanoscale structure is formed. The various instances of deposits and regrowths may have varying sizes and shapes and may be of varying materials.

Other advantages, aspects, and features of the invention will become apparent from the following detailed description of the invention when considered in conjunction with the accompanying drawings.

BRIEF DESCRIPTION OF THE DRAWINGS

A more complete understanding of the present embodiments and advantages thereof may be acquired by referring to the following description taken in conjunction with the accompanying drawings, which relate to embodiments of the present disclosure.

DETAILED DESCRIPTION

The present invention relates to selective material regrowth for the creation of nanoscale structures, methods of forming such structures, and their use. The present invention involves the selective deposition of a material in a predefined window region of a substrate or layer and the concurrent engineering of the varying deposition conditions near the window edges to engineer a tailored structure. The selective regrowth structures and associated methods are compatible with any form of lithography.

More specifically, a mask may be formed by patterning a substrate (e.g., a semiconductor wafer that may or may not include a variety of material layers) with a mask material capable of withstanding the subsequent process conditions. For example, the mask may be a "hard mask," comprising a refractory metal. A section of the substrate and mask material may be selectively etched using a variety of etching processes such as reactive ion etching (RIE). The selective etching may be done in such a way as to create "windows" or openings in the material composed of the masking material and substrate. Another material (e.g., a semiconductor material) may then be deposited in the windows in a manner that leaves a gap between the material and the original substrate, as described in more detail below with reference to FIGS. 2-9. Another material (e.g., the substrate material, the first material, or a different material) may then be regrown over the other material using a deposition process condition that fills the gap region and overgrows the other semiconductor material, and the masking material removed. This process may be repeated as necessary to achieve the desired material structure.

As alignment and mask openings necessary to create nanoscale structures are difficult to achieve and very expensive, selective regrowth may allow for fabrication with reduced complexity and cost. For example, the traditional approach of sequentially patterning, etching, and deposition to realize a fabricated structure becomes unfeasible due to the physics of optical fringing (making the window pattern difficult or impossible to open) or unrepeatable in a production environment due to the immense difficulty of aligning the window patterns of subsequent mask layers. The present invention may alleviate these difficulties by relying on only one mask step.

Figure 1:
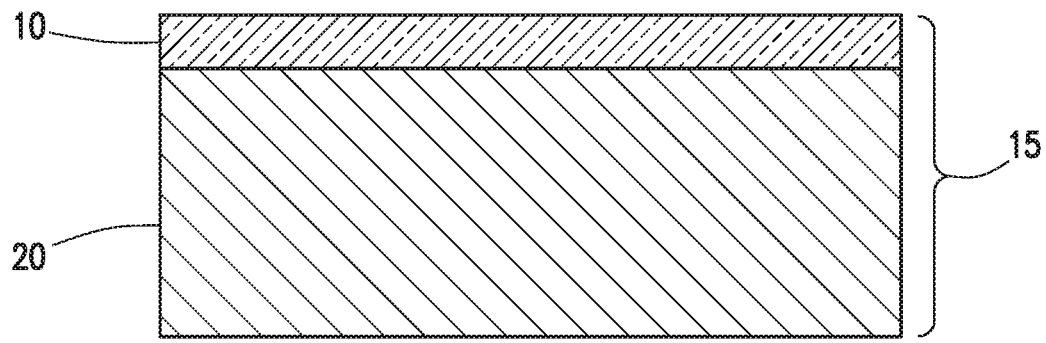
FIG. 1 shows a cross-section view of a material stack for selectively growing nanostructures.

In one embodiment of the disclosure, the selective growth process may begin by depositing a first semiconductor layer 10 onto a base layer 20, as shown in FIG. 1. This may be done by a variety of methods such as metalorganic chemical vapor deposition (MOCVD). For example, first semiconductor layer 10 may be any appropriate semiconductor material such as aluminum gallium nitride. Base layer 20 may be any appropriate base layer such as aluminum nitride. Material stack 15 (comprising first semiconductor layer 10 and base layer 20) may then be patterned with mask material 30 capable of withstanding the subsequent process conditions. For example, mask material 30 may be a "hard mask," comprising a refractory metal.

Figure 2:
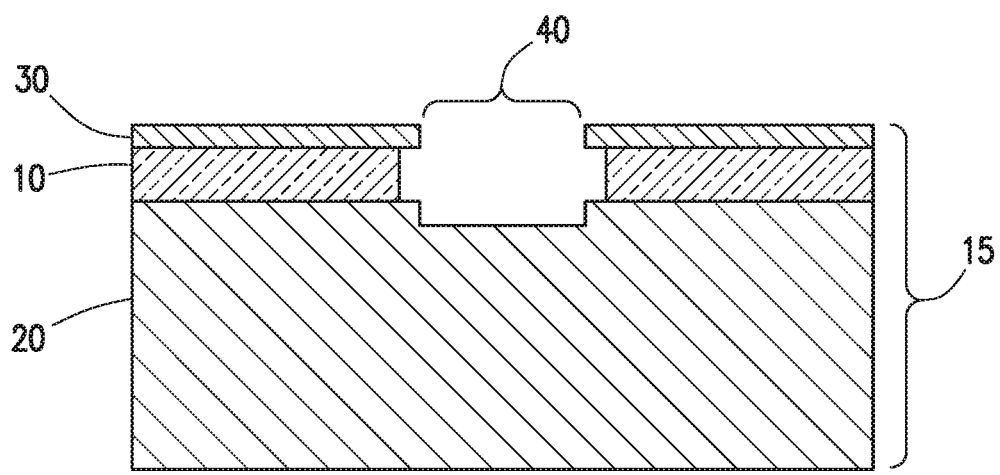
FIG. 2 shows a cross-section view of a material stack, along with a mask material, having a window etched in to allow for the depositing of a second material.
Figure 3:
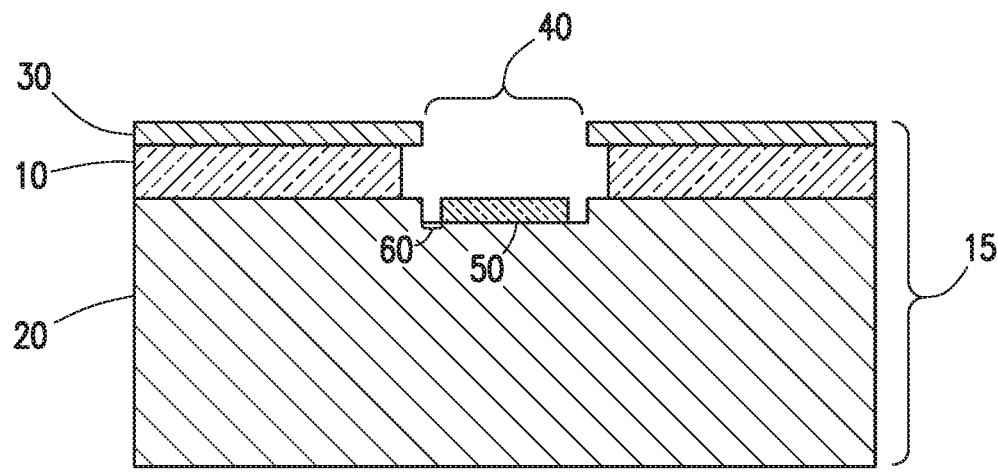
FIG. 3 shows a cross-section view of the second material deposited within the window such that a gap remains.

A portion of mask material 30 and material stack 15 may be selectively etched to create window 40, as shown in FIG. 2. This may be done by any appropriate etching processes such as RIE. Window 40 may be formed to be of a dimension appropriate to accommodate the desired nanoscale structure. Once formed, second semiconductor layer 50 may be deposited within window 40, as shown in FIG. 3. For example, the etched material stack and mask material may be placed within an MOCVD reactor in order to deposit second semiconductor layer 50 with thickness of 1-25 nm.

Second semiconductor layer 50 may be any appropriate material used to form the structure of the desired nanoscale structure, such as indium gallium nitride. Second semiconductor layer 50 may be deposited within window 40 such that a gap 60 remains between a portion of second semiconductor layer 50 and material stack 15. For example, gap 60 may be between 0.1 and 50 nanometers. In some embodiments, gap 60 may be of non-uniform width throughout window 40.

In some embodiments, the deposition of second semiconductor layer 50 may be controlled in such a manner as to provide a non-uniform layer of second semiconductor layer 50 within window 40. Certain variables may be adjusted to provide the desired layer depth of second semiconductor layer 50 such as the gas phase ratio of the reactant species (e.g., the ratio of nitrogen to indium/gallium used to create the indium gallium nitride), the temperature of material stack 15, and the pressure within the reactor chamber, among others.

Figure 4:
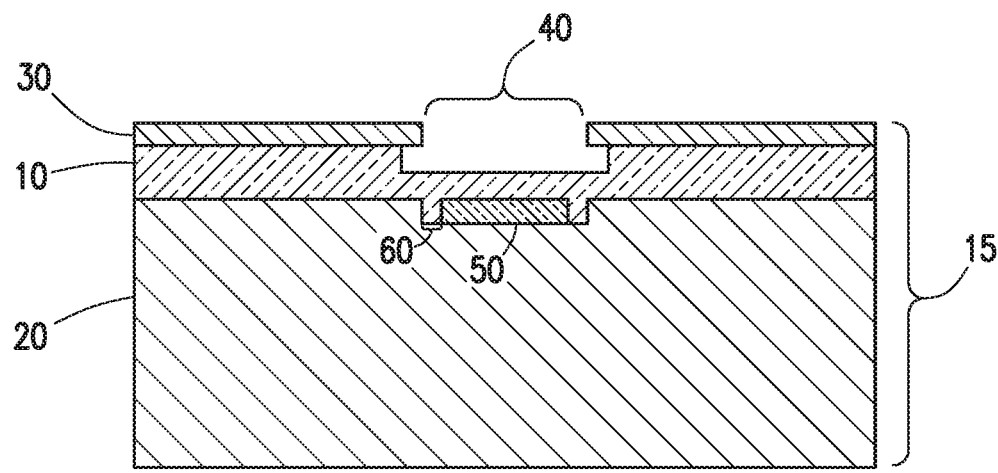
FIG. 4 shows a cross-section view of the gap having been filled by the regrown first layer.

Once second semiconductor layer 50 has been deposited, first semiconductor layer 10 may then be regrown in a manner that fills gap 60 and overgrows second semiconductor layer 50, as shown in FIG. 4. In some embodiments, the regrown material that fills gap 60 and overgrows second semiconductor layer 50 is comprised of a different material from first semiconductor layer 10 (not shown). Regrowing a layer of first semiconductor layer 10 allows the process of depositing layers of second semiconductor layer 50 to be repeated as necessary to create the desired nanoscale structure.

Figure 5:
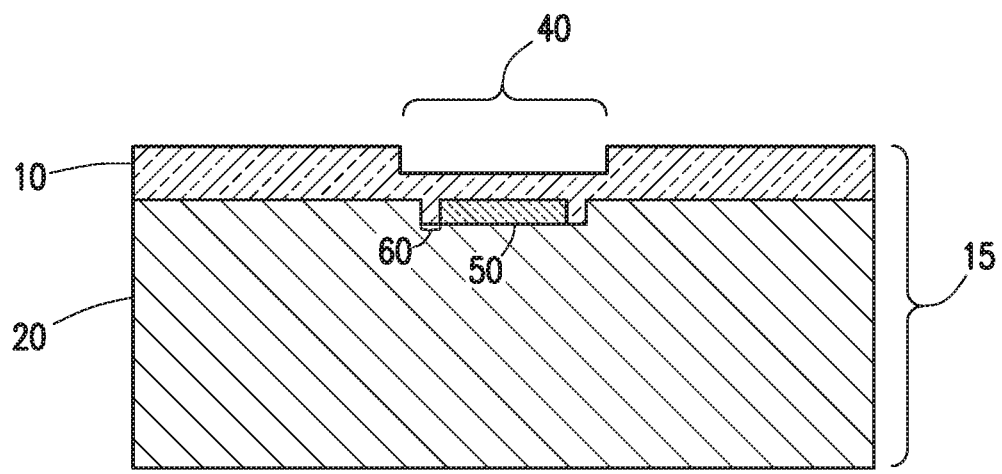
FIG. 5 shows a cross-section view of the structure of FIG. 4 having the mask material removed.

After filling gap 60 with first semiconductor layer 10, mask material 30 may be removed, as shown in FIG. 5. The mask material may be removed with a variety of selective etching processes, such as a wet etch in a non-chlorine chemistry. Once removed, the resulting space in first semiconductor layer 10 may allow for another deposition of second semiconductor layer 50, thus eliminating the need for a second masking step. In some embodiments, the resulting space in first semiconductor layer 10 may be deposited with a third semiconductor material (not shown).

When the process is repeated, the deposition of second semiconductor layer 50 may be the same as, substantially similar to, or different from the prior deposition of second semiconductor layer 50. Further, the size and shape of the deposition may vary from instance to instance, as may the size and shape of gap 60. Finally, when repeated, the material comprising second semiconductor layer 50 may be the same as, substantially similar to, or different from the prior deposition of second semiconductor layer 50. For example, as noted above, the shape and thickness of the second semiconductor layer 50 may be controlled by a number of variables. By altering these variables for each selective regrowth instance, the size and shape of the second semiconductor layer 50 may be different for each instance.

Figure 6:
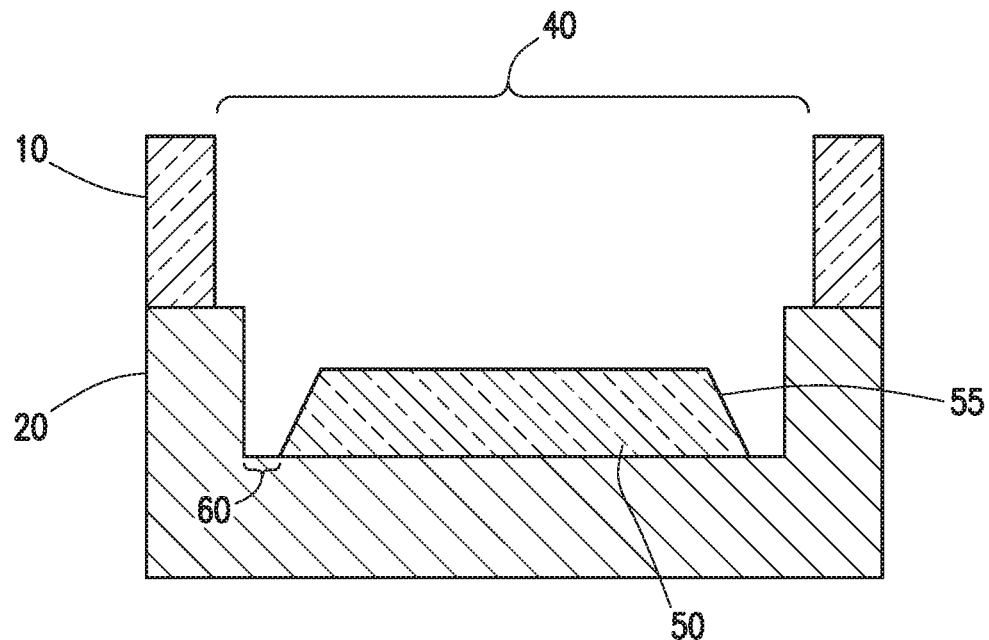
FIG. 6 shows a cross-section view of one embodiment of the deposited second material prior to the first material being regrown.

The size and shape of the deposited layer of second semiconductor layer 50 may also be used to improve the fabrication process. As shown in FIG. 6, sidewalls 55 of second semiconductor layer 50 may be engineered so as to be non-vertical. The shape of sidewalls 55 may be such that gap 60 is concave. In the same or alternative embodiments, sidewalls 55 may be engineered such that gap 60 is convex.

Growing second semiconductor layer 50 in a manner that results in non-vertical sidewalls 55 may provide advantages to the manufacturing process over currently available methods. For example, one current process uses a "shadow" technique through the use of an angled substrate to leave a notch with a physical vapor deposition process. However, this technique may be unable to realize a uniform notch around the entire perimeter of a window.

Figure 7:
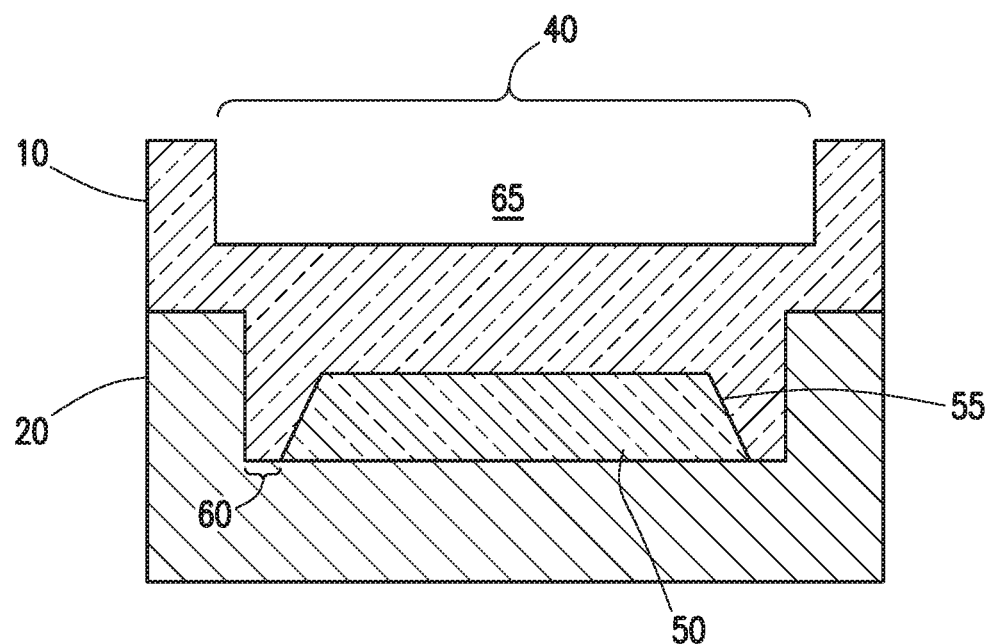
FIG. 7 shows a cross-section view of one embodiment of the deposited second material after the first material has been regrown.

In some embodiments, second semiconductor layer 50 may be overgrown by another instance of first semiconductor layer 10, as shown in FIG. 7. The size of window 65 in the first semiconductor layer 10 of FIG. 7 may be the same as, substantially similar to, or different from the size of window 60. This may allow for a deposition of another instance of second semiconductor layer 50 that may or may not be the same size and/or shape of the prior instance of second semiconductor layer 50.

In specific embodiments, first semiconductor layer 10 may be formed from a combination of aluminum (Al), gallium (Ga) and nitrogen (N). For example, it may be formed from $Al_{0.15}Ga_{0.85}N$. Other semiconductor-appropriate materials may also be included or used in place of Al, Ga, or N. The proportions of materials may also be varied. Similarly, second semiconductor layer 50 may be made of a combination of indium (In), gallium (Ga) and nitrogen (N), for example $In_{0.15}Ga_{0.85}N$, but other semiconductor-appropriate materials may be included or used in place of In, Ga, or N and the proportions of material may also be varied.

In other specific embodiments, base layer 20 may be formed from aluminum nitride (AlN). In other embodiments, it may be formed from any appropriate material to allow formation or support of semiconductor layer 10.

Figure 8:
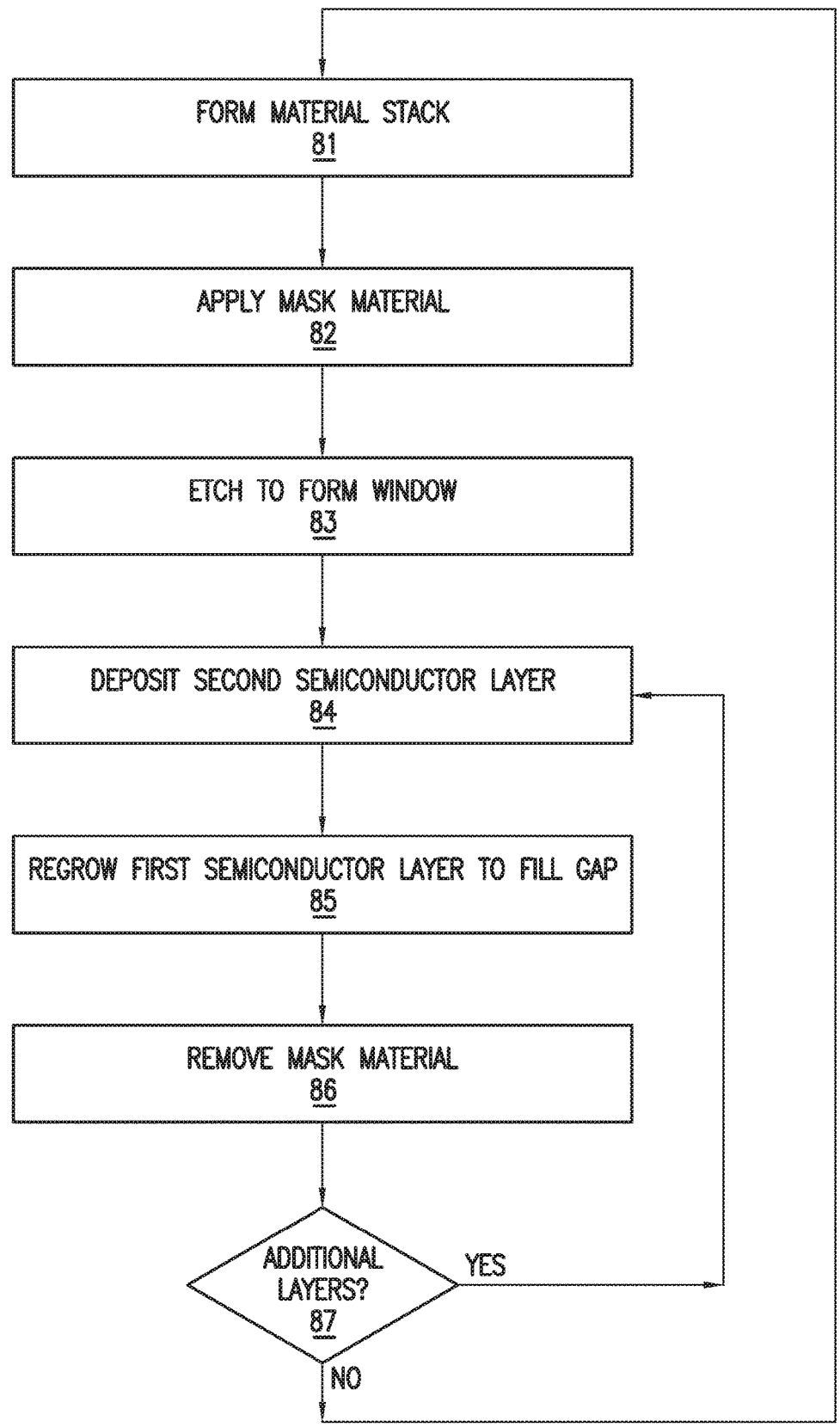
FIG. 8 shows an example flowchart of a method for selectively regrowing layers in order to create a nanoscale structure.

The method 80 of creating nanostructures using selective regrowth of semiconductor material is shown in FIG. 8. According to one embodiment, method 80 preferably begins at step 81. Teachings of the present invention may be implemented in a variety of configurations. As such, the preferred initialization point for method 80 and the order of steps 81-87 comprising method 80 may depend on the implementation chosen.

At 81, material stack 15 may be formed, as described in more detail above with reference to FIG. 1. For example, first semiconductor layer 10 may be deposited on base layer 20 in order to form material stack 15. Once formed, method 80 may proceed to 82, wherein mask material 30 may be applied to allow for the selective etching of mask material 30 and material stack 15, as described in more detail above with reference to FIG. 2. Once mask material 30 is in place, method 80 may proceed to 83.

At 83, mask material 30 and material stack 15 may be selectively etched to form window 40, as described in more detail above with reference to FIG. 2. Once window 40 is formed, method 80 may proceed to 84, wherein second semiconductor layer 50 may be deposited within window 40, leaving gap 60 between second semiconductor layer 50 and material stack 15, as described in more detail above with reference to FIGS. 3 and 6. With second semiconductor layer 50 in place, method 80 may proceed to 85, wherein first semiconductor layer 10 may be overgrown to fill gap 60 and, if necessary or desired, overgrow second semiconductor layer 50, as described in more detail above with reference to FIGS. 4 and 7. With a new instance of first semiconductor layer 10, method 80 may then proceed to 86, wherein mask material 30 may be removed from material stack 15, as described in more detail above with reference to FIG. 5.

Once mask material 30 has been removed, method 80 may proceed to 87, wherein a determination is made as to whether additional instances of second semiconductor layer 50 are desired. If so, method 80 may return to 84, wherein another instance of second semiconductor layer 50 may be deposited. If no other instance are desired, method 80 may return to 81 or terminate.

Although FIG. 8 illustrates a particular number of processes taking place with respect to method 80, method 80 may be executed with more or fewer than those depicted.

Although only exemplary embodiments of the invention are specifically described above, it will be appreciated that modifications and variations of these examples are possible without departing from the spirit and intended scope of the invention. For instance, numeric values expressed herein will be understood to include minor variations and thus embodiments "about" or "approximately" the expressed numeric value unless context makes clear that the number is intended to be a precise amount. The terms height and depth may be used interchangeably herein. Those skilled in the art would readily appreciate that all parameters listed herein are meant to be exemplary and that the actual parameters would depend upon the specific application for which the materials and methods of the invention are used. It is, therefore, to be understood that the foregoing embodiments are presented by way of example only and that, within the scope of the appended claims and equivalents thereto, the invention may be practiced otherwise than as specifically described.

It should be understood that when a layer or material is referred to as being "on" or "over" another layer, material or substrate, it can be directly on the layer, material or substrate, or an intervening layer or material may also be present. It should also be understood that when a layer or material is referred to as being "on" or "over" another layer, material or substrate, it may cover the entire layer, material or substrate, or a portion of the layer, material or substrate.

The invention claimed is:

1. A method for creating a nanoscale structure, the method comprising:
   forming a window in a semiconductor structure, the semiconductor structure comprising a substrate, a first semiconductor layer, and a mask layer;
   depositing a second semiconductor layer within the window such that a gap exists between the second semiconductor and a portion of the first semiconductor layer and/or the substrate; and
   regrowing the first semiconductor layer to form a regrown first semiconductor layer, wherein the regrown first semiconductor layer fills the gap.

2. The method of claim 1, further comprising removing the mask layer prior to regrowing the regrown first semiconductor layer.

3. The method of claim 1, wherein the regrown first semiconductor layer overgrows the second semiconductor layer.

4. The method of claim 1, wherein the second semiconductor layer comprises a sidewall that is non-vertical.

5. The method of claim 4, wherein the gap is concave.

6. The method of claim 4, wherein the gap is convex.

7. The method of claim 3, further comprising depositing a third semiconductor layer on the regrown first semiconductor layer.

8. The method of claim 7, wherein the third semiconductor layer comprises a different material than the second semiconductor layer.

9. The method of claim 7, wherein the third semiconductor layer is a different size than the second semiconductor layer.

10. The method of claim 7, wherein the third semiconductor layer is a different shape than the second semiconductor layer.

11. The method of claim 1, wherein the first semiconductor layer comprises a different material than the regrown first semiconductor layer.

* * * * *

UNITED STATES PATENT AND TRADEMARK OFFICE
CERTIFICATE OF CORRECTION

| | | |
|---|---|---|
| PATENT NO. | : 10,903,076 B2 | Page 1 of 1 |
| APPLICATION NO. | : 16/568658 | |
| DATED | : January 26, 2021 | |
| INVENTOR(S) | : Edwin L. Piner | |

It is certified that error appears in the above-identified patent and that said Letters Patent is hereby corrected as shown below:

On the Title Page

Item (60), Line number 1:   Replace "Oct. 29, 2016" with
-- Oct. 19, 2016 --

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*